United States Patent [19]
Endriz

[11] Patent Number: 5,802,092
[45] Date of Patent: *Sep. 1, 1998

[54] DIODE LASER SOURCE WITH CONCURRENTLY DRIVEN LIGHT EMITTING SEGMENTS

[75] Inventor: John Endriz, Belmont, Calif.

[73] Assignee: SDL, Inc., San Jose, Calif.

[*] Notice: The term of this patent shall not extend beyond the expiration date of Pat. No. 5,594,752.

[21] Appl. No.: 738,216

[22] Filed: Oct. 25, 1996

Related U.S. Application Data

[63] Continuation of Ser. No. 269,358, Jun. 30, 1994, Pat. No. 5,594,752, which is a continuation-in-part of Ser. No. 986,207, Dec. 7, 1992, Pat. No. 5,745,153.

[51] Int. Cl.$^6$ ............... H01S 3/18; H01S 3/19; G02B 27/10
[52] U.S. Cl. ............... 372/50; 372/43; 359/622
[58] Field of Search ............... 372/50, 43, 75; 347/133, 233, 241, 244; 385/11; 359/622

[56] References Cited

U.S. PATENT DOCUMENTS

| | | | |
|---|---|---|---|
| 4,428,647 | 1/1984 | Sprague et al. | 350/167 |
| 4,520,472 | 5/1985 | Reno | 369/112 |
| 4,553,148 | 11/1985 | Behrens et al. | 346/107 R |
| 4,613,877 | 9/1986 | Spencer et al. | 347/133 |
| 4,674,095 | 6/1987 | Heinen et al. | 372/50 |
| 4,743,091 | 5/1988 | Gelbart | 350/252 |
| 4,804,975 | 2/1989 | Yip | 346/76 L |
| 4,813,762 | 3/1989 | Leger et al. | 372/44 |
| 4,870,652 | 9/1989 | Thornton | 372/50 |
| 4,939,630 | 7/1990 | Kikuchi et al. | 362/268 |
| 4,972,427 | 11/1990 | Streifer et al. | 372/92 |
| 4,978,974 | 12/1990 | Etzel | 346/107 R |
| 5,081,637 | 1/1992 | Fan et al. | 372/72 |
| 5,109,460 | 4/1992 | Baek et al. | 385/115 |
| 5,139,609 | 8/1992 | Fields et al. | 372/50 |
| 5,163,058 | 11/1992 | Farries et al. | 372/6 |
| 5,168,401 | 12/1992 | Endriz | 359/625 |
| 5,185,758 | 2/1993 | Fan et al. | 372/72 |
| 5,212,707 | 5/1993 | Heidel et al. | 372/50 |
| 5,216,687 | 6/1993 | Fujino et al. | 372/70 |
| 5,299,219 | 3/1994 | Hayakawa | 372/50 |
| 5,300,956 | 4/1994 | Ohta et al. | 347/233 |
| 5,317,170 | 5/1994 | Paoli | 372/50 |
| 5,402,436 | 3/1995 | Paoli | 372/50 |
| 5,475,416 | 12/1995 | Kessler et al. | 347/244 |
| 5,533,152 | 7/1996 | Kessler | 385/11 |
| 5,594,752 | 1/1997 | Endriz | 372/50 |
| 5,619,245 | 4/1997 | Kessler et al. | 347/241 |

FOREIGN PATENT DOCUMENTS

| 193102 | 8/1988 | Japan | 359/619 |

*Primary Examiner*—Rodney B. Bovernick
*Assistant Examiner*—Quyen Phan Leung
*Attorney, Agent, or Firm*—W. Douglas Carothers, Jr.

[57] ABSTRACT

A diode laser source including a laser diode whose emitting element array or elements or subarray is divided into a plurality of concurrently driven laser segments. Beam filling and focusing optics are disposed in front of the segments so that light from the segments in each element or subarray converges to a single overlapping spot. The optics include a beam filling lens array collimating the light from the segments and either a single focusing lens or a second lens array focusing the collimated light to corresponding spots. In the case of a element laser diode array, each multi-segment element or subarray of the array is individually addressable so as to be driven independently from the other multi-elements array elements. The segmentation of laser elements improves laser life by reducing thermal gradients and isolating any local failures to a single segment, while separately focusing of the segments of each subarray to overlapping light spots increases the tolerance of the source to local failures. Two or more segments in a given element or subarray must fail before the source is considered to fail.

35 Claims, 3 Drawing Sheets

DIODE LASER SOURCE WITH CONCURRENTLY DRIVEN LIGHT EMITTING SEGMENTS

CROSS-REFERENCE TO RELATED APPLICATIONS

This application is a continuation of patent application Ser. No. 08/269,358, filed Jun. 30, 1994, now U.S. Pat. No. 5,594,752, which is a continuation-in-part of patent application Ser. No. 07/986,207, filed Dec. 7, 1992, now U.S. Pat. No. 5,745,153.

BACKGROUND OF THE INVENTION

1. Technical Field

The present invention relates to optical system for semiconductor laser diodes and optical elements therefor, and in particular relates to a multibeam optical unit for high brightness, monolithically integrated diode laser arrays with beam filling optics.

2. Background Art

In U.S. Pat. No. 4,428,647, Sprague et al. describe an optical system, such as a multi-channel optical disk recorder or a laser printing system, having a laser array with a plurality of laser sources providing a plurality of output light beams. Each of the laser sources in the array has its own current drive which can be modulated, independently of the other sources, dependent on the desired output power of the emitted light beam from that source. The optical system also includes a focusing objective lens which images the plural light beams onto the surface of a photosensitive medium. The objective lens is located a substantial distance from the emitting surface of the laser array relative to its distance to the photosensitive medium to provide enough demagnification of the array of light beams that the spacings of the imaged light spots on the medium are substantially less than the spacings of the light beams at the laser array. A 125-fold reduction in the light spot spacings from 250 µm at the laser array emitting surface to just 2 µm at the medium is typical. Even overlapped or concentric light beams are suggested as a possibility. Due to the point source nature of the light beams emitted from the described array, those beams typically have a large divergence angle. In order to enable a large portion of each of the light beams to be collected by the objective lens so that light spots of significant power are imaged onto the photosensitive surface, the optical system further includes an array of lenses, one for each laser source in the laser array, located in the optical path between the laser array and objective lens. Each lens in the lens array reduces the divergence angle of the light beam received from its associated laser source so that substantially all of the light collected by each lens will enter the objective lens without changing the apparent beam spacing of the laser array seen by the objective lens. Lenses with cylindrical symmetry may be used to shape the individual laser beams and to compensate for laser astigmatism.

U.S. Pat. Nos. 4,972,427 to Streifer et al., 5,081,637 and 5,185,758 to Fan et al., and 5,168,401 to Endriz disclose other laser optical system of the prior art which position lens arrays in front of corresponding arrays of laser diodes. In the patents to Fan et al., the collimated light emerging from the lens arrays are focused by a lens in order to converge the beams so that they overlap in a solid-state gain medium for optically pumping that medium. Streifer et al. place a lens array within an external Talbot cavity. A separate cylindrical collection lens is use to reduce the divergence in the transverse direction perpendicular to the plane of the laser diode emitters, while the individual lenses of the lens array collimate the light beams in the lateral direction parallel to the plane of the array. Endriz combines a lens array with a corresponding array of turning mirrors which transform the lateral and transverse dimensions of each source in the laser array. The lens elements in the lens array are preferably positioned such that the light beams are allowed to diverge to completely fill the space between the transformed light from adjacent sources. Each light source in the array may be separately modulated.

In U.S. Pat. No. 4,674,095, Heinen et al. describe a laser diode array provided with a plurality of laser diode strips. The laser diode strips are parallel to each other and are divided into groups. Typical strips are 2 to 4 µm wide and are spaced about 10 to 20 µm apart. Neighboring groups of laser diode strips are separated by strip-shaped zones extending essentially parallel to the laser diode strips. The zones substantially attenuate super-radiation or laser radiation propagating in a direction other than the prescribed emission direction parallel to the laser diode strips. Up to a maximum of about 10 to 40 laser diode strips can belong to each group, depending on the gain in the laser, the quality of the resonator and other parameters. The attenuating zones may be constructed by proton implantation, channels etched through the active region, or other means. The partitioning provided by the attenuating zones increases the maximum output power attainable from the array and improves efficiency.

Among the commercially available laser diodes, the 2300 series of laser sold by SDL, Inc. provides up to 4 W cw optical output power and high brightness from laser diodes with a broad area emitting aperture. For example, the SDL-2360 has a 100 wide by 1 µm high emitting aperture and provides a 1.2 W cw output with a 100 ∥ by 30° ⊥ FWHM beam divergence. The available wavelength range is approximately 790 to 860 nm. The laser output is modulatable with rise and fall times of about 500 ps (2 GHz modulation bandwidth). Among the linear array laser diodes sold by SDL, Inc. are the SDI-3400 series of laser bars. For example, the SDL-3460 has 18 laser emitters driven in parallel and providing up to 20 W cw optical output power or about 1.1 W per emitter. Each emitter has a 200 µm wide emitting aperture with a 30 gap centered within the emitting aperture. The emitters in the array have a 540 µm center-to-center spacing. The beam divergence is 10° ∥ by 30° ⊥ FWHM.

An important concern of manufacturers of laser diodes is improving the reliability of their products. In the case of broad area lasers, a local failure in any portion of the emitting aperture will tend to grow and propagate across the entire aperture area, resulting in a complete failure of the emitter. In the case of laser arrays, particularly those arrays whose elements are intended to be independently driven, as in laser printing systems, the loss of a single emitting element will normally leave the entire array unusable. That is, in many laser diode applications the loss of just a single laser element cannot be tolerated. For large aperture lasers and multi-element arrays of such lasers, the probability of a single failure point taking out the entire aperture or array increases with increased aperture area. Further, at high power density, stochastic (random) failures are dominant, making life predictions a statistical process and making screening of such failures nearly impossible. The effect of gradual degradation processes on lifetimes at most power levels of interest is not significant compared to stochastic failure processes. Typical broad area lasers with a 100 µm wide emitting aperture operated at a 1.0 W optical output power have a medium lifetime on the order of 30,000 hours. Median failure rates for each element in 10-element laser arrays are comparable. However, since stochastic failures are essentially random in time, many of the laser elements will fail much sooner than the 30,000 hour average. Accordingly, median lifetime for a multi-element array of 1 Watt, 100 μm aperture elements will be much less than the element lifetime of 30,000 hours. Thus, improved lifetimes are sought. Because failure rates are correlated with operating power and temperature, due to thermal stresses resulting from temperature gradients across a device, a common technique for improving lifetimes is to rate the device for lower power levels and temperature ranges, so that less thermal stress occurs. However, it would be desirable to improve reliability without having to sacrifice output power and brightness or their use in extreme temperature environments.

An object of the present invention is to provide an optical unit with a diode laser source with a laser element or array, or with multi-elements or subarrays having a plurality of segments with significantly improved lifetime for a given output power, output brightness (W cm$^{-2}$ sr$^{-1}$) and operating temperature rating.

SUMMARY OF THE INVENTION

The object has been met with an optical unit with a laser diode source in which a broad area laser's light emitting element or array or each element of a multi-element laser array is divided into a plurality of separate, spaced apart laser segments, each segment of a particular laser element or subarray being concurrently driven or addressed in parallel with the other segments of that element, or subarray and in which beam filling and focusing optics are disposed in front of each element to converge the light beams emitted from the plural segments of that element to a single overlapping spot for that element, so as to preserve the brightness of the individual segments in the reconstructed multi-segment element. For a multi-element laser array, each of the plurality of segmented laser elements or subarrays is individually addressable. That is, the laser segments of each element or subarray, though driven in parallel with the other segments of that same element or subarray, are driven independently of the laser segments of the other elements or subarrays of the array. The resulting source of spaced apart laser light spots, one for each laser element or subarray of the source, has optical power and brightness for each light spot which is independent of the optical power and brightness of every other light spot of the array. The optics may include a lens array with each lenslet of the lens array disposed in front of one of the laser segments for providing beam filling collimation of the light from each segment, and a focusing lens or, in the case of a multi-element or subarray laser array, a second lens array disposed in front of each laser element for converging the collimated light beams of each segment of an element or subarray to a single overlapping spot relative to an element.

The diode laser source has improved reliability because it is able to tolerate the failure of at least one segment in a laser element without the concomitant failure of the laser element as a whole. Since the light from all of the segments in a laser element are focused down to a single overlapping spot in the far field, the loss of one segment has only marginal effect on the element's spot size and produces only a slight decrease in optical power and brightness of the spot which can be compensated for by the remaining operating segments. The laser source as a whole will only fail when multiple segments in the same element fail, thereby resulting in a substantial lifetime improvement from stochastic (random) failure processes. Even the failure of a large number of segments in a single element might be tolerated in some devices and in some applications, further increasing the device's useful life.

Further, because of the division of a laser element into multiple spaced apart segments, a local failure will only affect one segment and not the entire element. Because the segments are spaced apart from each other, a failure in one segment will not tend to propagate to adjacent segments. Additionally, the smaller size of the segments and their spaced apart relation provides reduced thermal stresses from temperature gradients. This reduces the failure rate of any lasing segment, further increasing laser life.

DESCRIPTION OF DETAILED EMBODIMENTS

Figure 1:
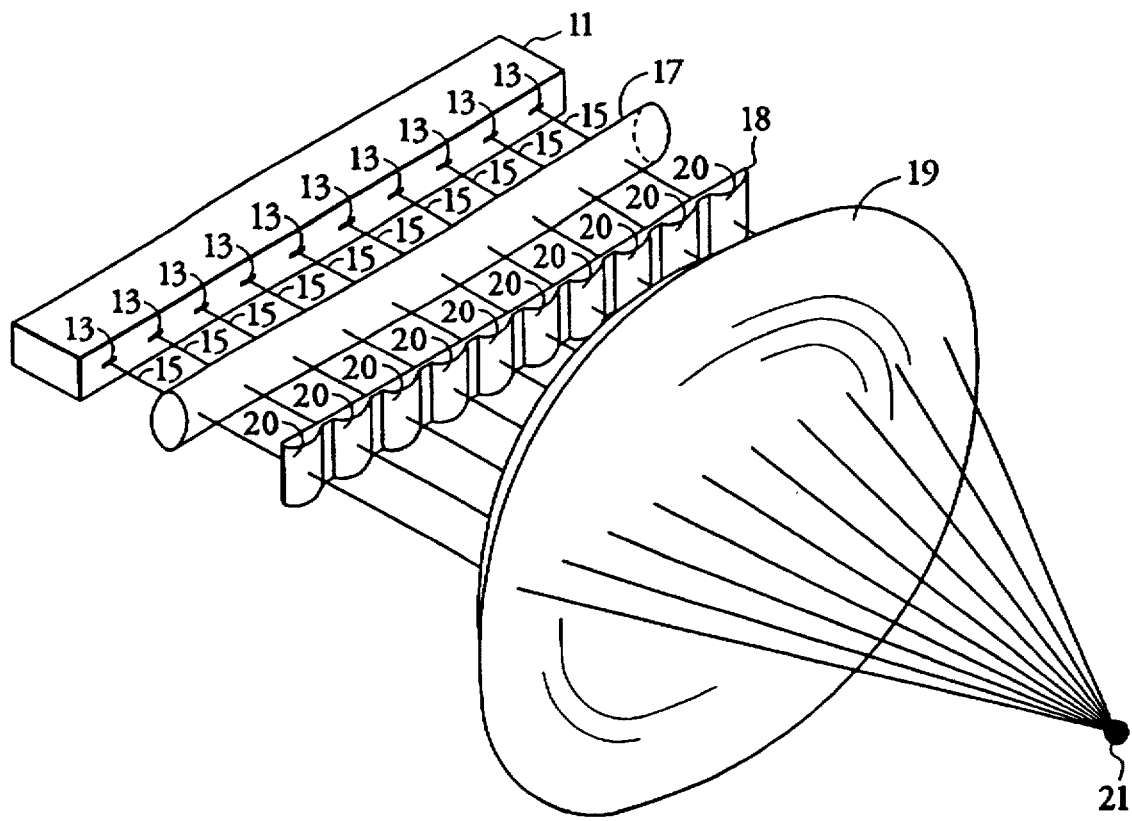
FIG. 1 is a perspective view of a first multibeam optical unit having a diode laser source of the present invention.
Figure 2:
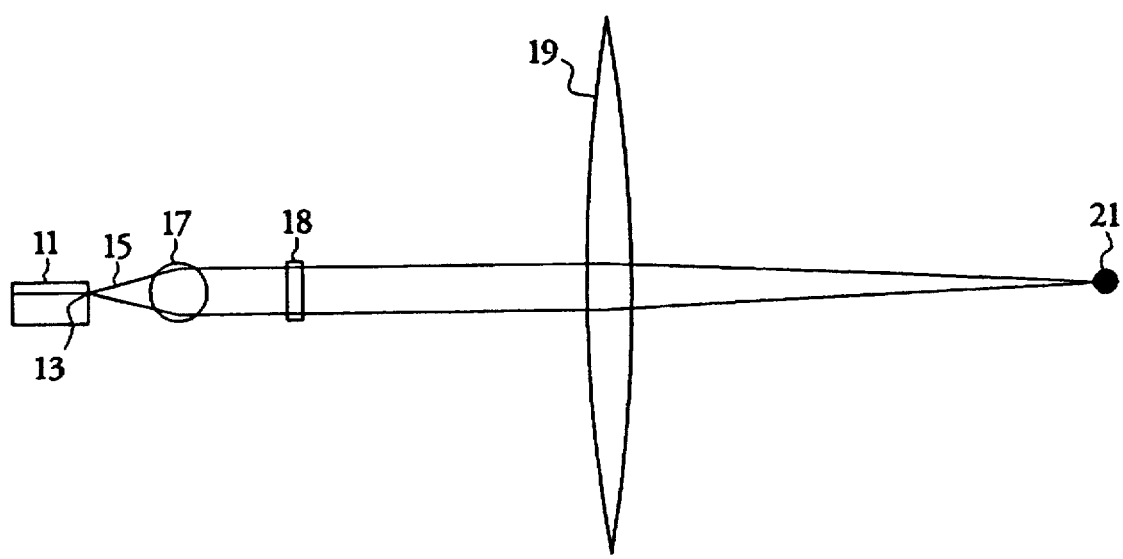
FIGS. 2 and 3 are respective side and top plan views of the laser source of FIG. 1.
Figure 3:
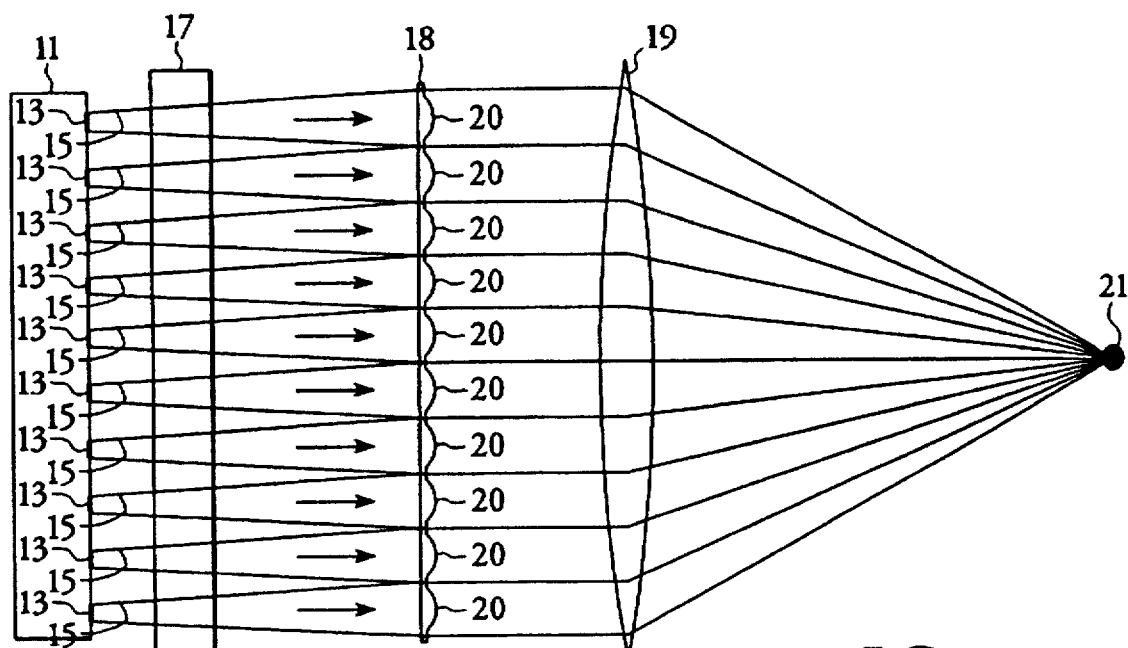

With reference to FIGS. 1–3, a first multibeam optical unit having diode laser source of the present invention, in this instance a single-element broad-aperture laser source, includes a laser diode source 11 in which the broad area light emitting aperture comprises broad area light emitting element or array comprising multiple spaced apart segments 13. Each segment has a width which is preferably less than about 20 μm. The segments 13 are concurrently driven in parallel to generate multiple light beams 15. A typical 0.5 W to 1.2 W cw broad area laser diode of the prior art has an overall aperture width of about 50 μm to 100 μm. In the segmented laser diode source 11 shown in FIGS. 1–3, this broad area light emitting aperture may be divided into 5 to 20 laser segments 13, each having an aperture width of about 3 to 6 μm, and each emitting about 30 mW to 60 mW cw of optical power. The center-to-center spacing between adjacent segments can typically range from 20 to 50 μm, with the overall width of the segmented emitting region ranging from 0.5 mm to 1.0 mm. The effective aperture size in the transverse direction perpendicular to the plane of the laser active region is about 1 μm. These ranges are merely typical and other dimensions might be used.

The diode laser source also includes beam filling and focusing optics 17–19 to condense the light output from the laser diode source 11 into a single overlapping laser light spot 21 in a manner that preferably preserves brightness. The optics may include a cylindrical lens 17, such as a 50 μm to 200 μm diameter fiber lens. This lens 17 reduces the transverse divergence or substantially collimates the light beams 15 in the direction perpendicular to the plane of the laser active region, as seen in FIG. 2, but has a negligible effect on the lateral divergence component other than to temporarily slow the lateral beam expansion as the light beams 15 pass through the cylinder lens 17. Typically, the transverse divergence of the light beams 15 is about 30° FWHM (±15°), but may be as much as ±30° in some lasers. For brightness conservation, the lens 17 should accept and be able to collimate at least 95% of the beam energy and have a high numerical aperture of about 0.5 NA. After passing through the lens 17, the transverse divergence of the beams 15 should be reduced to not more than ±60, and preferably is collimated to about ±0.3° divergence. Multiple cylinder lenses may be used, if necessary, to achieve the desired degree of divergence reduction.

The light beams next pass through a lens array 18. There may be from 10 to 20 lenslets 20 in the lens array 18, one lenslet 20 for each laser diode segment 13, with a 20 µm to 50 µm pitch equal to the center-to-center spacing between the segments 13. Preferably, the lens array 18 is positioned a distance away from the emitting segments 13 so that the light beams 15, with their typically lateral divergence of ±5° to ±10°, have diverged sufficiently to completely fill each lenslet 20 of the array 18. Typically, this distance is about 100 to 200 µm from the emitting surface of the laser diode source 11, depending on the lateral beam divergence, the refractive index and diameter of the cylindrical lens or lenses 17, and the center-to-center spacing of the emitters (equal to the lens array pitch). Each lenslet 20 reduces the divergence of its received light beam 15 to ±1° or less. The light emerging from the output surface of the lens array 18 appears to come from a single unsegmented virtual source whose brightness is preferably close to the brightness of the light from the individual segment 13.

Depending on the lateral and transverse beam divergences, it may be possible in some optical systems to combine the transverse collimation of the cylinder lens 17 (or from one of several such cylinder lenses, if more than one cylinder lens is required) with the lateral collimation of the lenslets 20 in a single lens array 18, by forming the lens array 18 with a cylindrical input surface instead of the planar surface shown, or by forming the lenslet output surfaces as ellipsoidal or toroidal surfaces instead of the cylindrical surfaces shown.

A focusing lens 19, not necessarily a spherical lens as shown, receives the light which has passed through and been substantially collimated by the lens array 18, and converges the light down to a single light spot 21 in the far field. A typical focal length of about 5 cm results in a convergence angle of about 0.6°. At the point in the far field where the light converges to a spot 21 the light contributions of each beam 15 from each segment 13 overlaps so that the loss of any one segment has little or no effect on the spot size. The focusing lens 19 can also be used to focus the beam received from the lens array 18 into an optical fiber, not shown. Such an optical fiber may then transmit the light combined from all segments to a remote location at the opposite end of the fiber where it is emitted as a single bright spot. Alternatively, the optical fiber might be a fiber amplifier or fiber laser using the focused light received from the lens 19 for pumping the active fiber medium.

Figure 4:
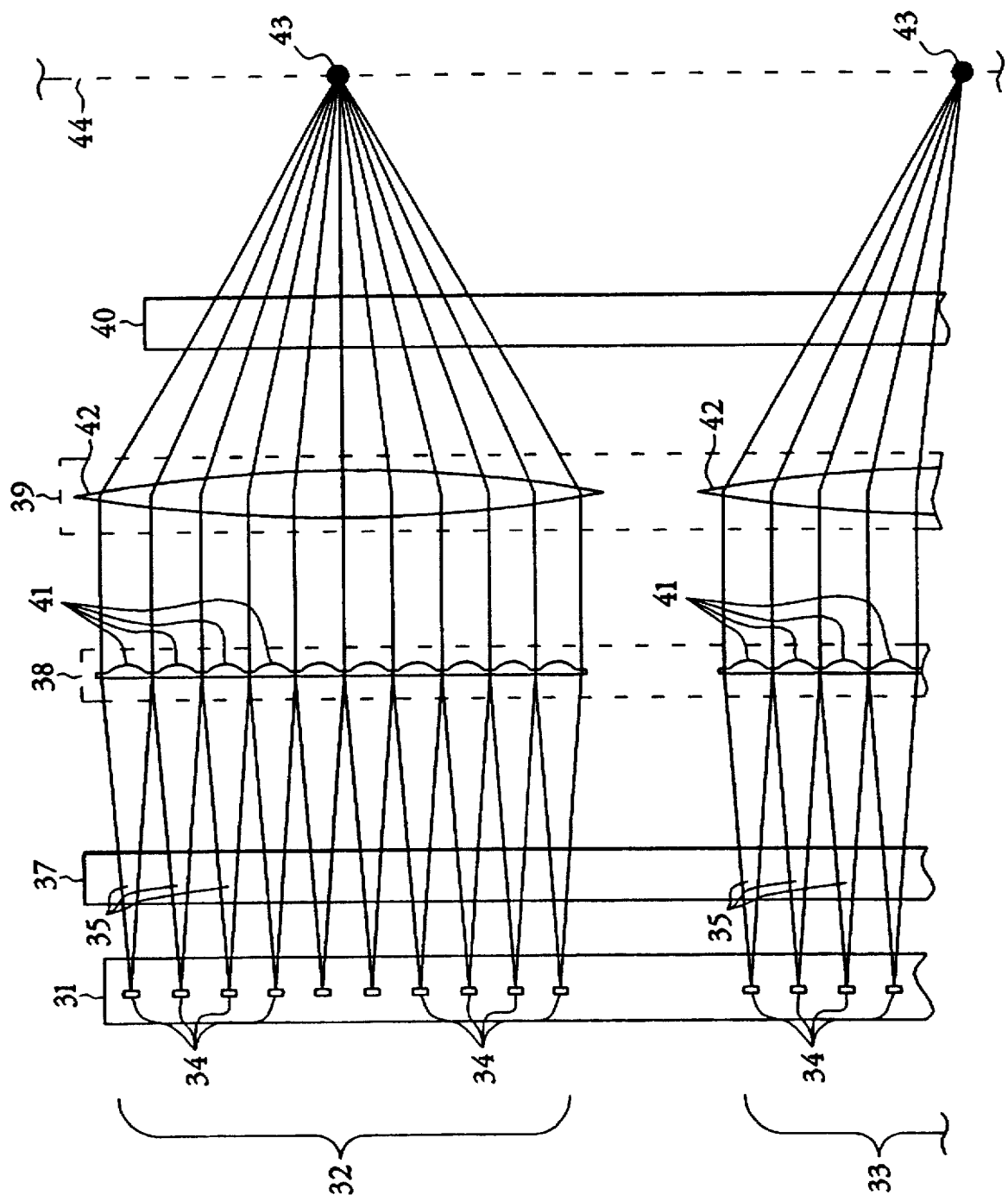
FIG. 4 is a top plan view of a portion of a second multibeam optical unit having a diode laser source of the present invention, including a laser diode with multiple laser elements, or subarrays of which all of a first and part of a second element or subarray are shown, which are further divided into laser segments.

With reference to FIG. 4, a second diode laser source of the present invention employs a multi-element or subarray laser diode array, where each laser element of the array is individually addressable, i.e. independently modulatable, and where each element or subarray of the array has been divided, like the broad aperture laser in FIGS. 1–3, into a plurality of spaced apart, concurrently driven, light emitting segments. As seen in FIG. 4, the laser source 31 includes a laser diode array with a plurality of individually addressable laser elements or subarrays 32, 33, etc. Although only a first laser element or subarray 32 and part of a second adjacent laser element 33 are seen in the figure, the laser diode array 31 typically may have 10 to 20 laser elements, each providing up to 0.5 W to 1.5 W of optical power. Each laser element or subarray 32, 33, etc. has a plurality of spaced apart laser segments 34. Although the laser element 32 is shown as having 10 segments, the number of laser segments 34 per laser element 32, 33, etc. typically may range from 5 to 20. All of the laser elements 32, 33, etc. normally have the same number of segments. The dimensions of and spacings between the individual laser segments 34 is typically the same as those given above for the segments 13 in FIGS. 1–3. The center-to-center spacing between the segmented laser elements 32, 33, etc. in the diode laser array 31 is typically about 1.0 mm, so the overall laser array 31 is a monolithic laser bar about 1.0 to 2.0 cm wide.

The diode laser source in FIG. 4 also includes beam filling and focusing optics 37–40. Cylinder lens 37 receives the light beams 35 emitted from all segments 34 of all laser elements or subarrays 32, 33, etc. and substantially reduces the transverse divergence in the direction perpendicular to the plane of the array in a manner substantially similar to the action of the cylinder lens 17 in FIGS. 1–3. Cylinder lens 37 typically has a diameter of between 50 and 200 µm and a numerical aperture of about 0.5. A microlens array 38 has lenslets 41 disposed in front of each of the laser segments 34 and substantially reduces the lateral divergence of the received light beams 35 in the direction parallel to the plane of the array in much the same way as the lenslets 20 of the lens array 18 in FIGS. 1–3. The lenslets 41 are grouped together in an arrangement that corresponds to the positions of the segments 34 grouped into laser elements or subarrays 32, 33, etc. Thus, lenslets 41 have a pitch of about 20 to 50 µm and groups of lenslets 41 have about a 1.0 mm center-to-center spacing exactly matching the corresponding 30 to 50 µm center-to-center spacing of the segments 34 in each laser element or subarray 32, 33, etc. and the 1.0 mm center-to-center spacing between adjacent laser elements or subarrays 32, 33, etc. As with the lens array 18 in FIGS. 1–3, the lens array 18 is preferably positioned at a distance from the laser source 31 that allows the lateral divergence of the beams 35 from each laser segment 34 to completely fill up the lenslets 41. When collimated by the lens array 38, the light from any one laser element or subarrays 32, 33, etc. appears to come from a single broad-area virtual source. A second lens array 39 with lenslets 42 is disposed on the output side of the first lens array 38 to receive the collimated light therefrom. Each lenslet 42 is positioned to receive light from one multi-segment laser element or subarrays 32, 33, etc. and to converge the light from that laser element or subarray 32, 33, etc. down to a light spot 43, just as focusing lens 19 in FIGS. 1–3 converges the light down to a light spot 21. As there are multiple laser elements 32, 33, etc. in the laser array 31 in FIG. 4, there are a corresponding number of lenslets 42 in the lens array 39 and a like number of laser spots 43 formed by the lens array 39. If necessary, a second cylinder lens 40 may focus the light transversely to the spots 43 while the lens array 39 separately focuses the light laterally to the spots 43. Alternatively, the lens array 39 may focus the light both laterally and transversely, obviating the need for a second cylinder lens 40.

Figure 5:
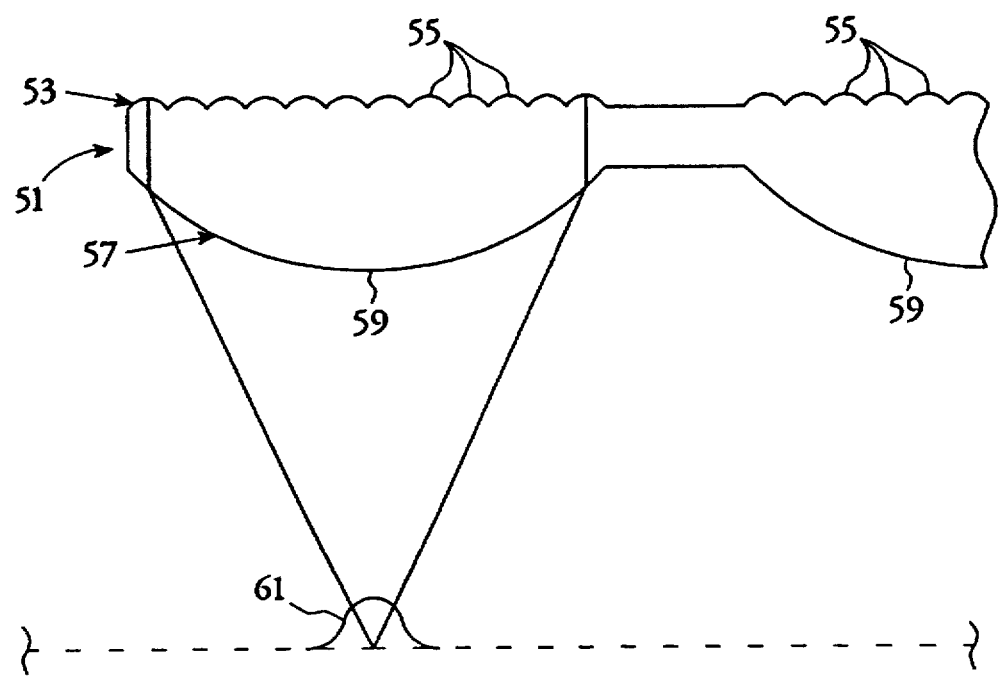
FIG. 5 is a sectional view cut through the optical axes of a portion of an alternative beam filling and focusing lens array for use with the laser source of FIG. 4.

Referring to FIG. 5, the two lens arrays 38 and 39 in FIG. 4 with their respective lenslets 41 and 42 may be replaced by a single lens array 51. The lens array 51 has an input surface 53 with a plurality of small lenslets 55 (each 20–50 µm wide) formed thereon and aligned with the individual laser segments 34 of a segmented multi-element laser array. The lens array 51 also has an output surface 57 with a plurality of larger lenslets 59 aligned with the multi-segment laser elements or subarrays 32, 33, etc. of the laser array. The small lenslets 55, preferably positioned where the diverging light from the laser segments completely fills the lenslets 55, substantially collimates the light, while the larger lenslets 59 focuses the light from the laser elements down to light spots 61, one for each laser element. At the light spots, the light from the laser segments in the respective laser elements overlaps so that the loss of any one segment in any element will not cause the total loss of an entire laser element. Alternatively, the lens structure 51 can be manufactured as a single planar structure using binary diffractive optics.

In order to see the usefulness of the segmented laser structure, it is advantageous to examine the failure statistics for both an array of broad area (unsegmented) laser elements of the prior art and an array of segmented laser elements of the present invention. Stochastic (random) failures in any one region of a large aperture device appear to be essentially uncorrelated with the probability of failure in another region. However, the effect of the failures in the broad area and segmented arrays is quite different. In the broad area laser, the failure in one region of the device results in a complete loss of the entire laser element and the end of the usefulness of the entire array. In contrast, in the segmented laser, the failure in any one region of the device causes a loss of just one laser segment. As noted above, the failure of at least one segment in any laser element can be tolerated and does not result in a complete loss of the laser element. For this analysis, an assumption is made that loss of two segments in one laser element results in the failure of that laser element and thus of the laser array. However, it is, possible that in many applications a loss of two segments in one laser element is tolerable, further increasing laser life. The minimum size of a light emitting region for which a failure probability is defined for comparison purposes is the aperture width of a laser segment. The probability of a stochastic failure of this size region in a given length of time is referred to as P.

For a broad area laser array with N laser elements, each with an aperture width of M times the defined region size, the overall probability of failure of the entire bar is the probability of failure in any one of the regions, i.e. N×M×P. As an example, assume the probability P is defined for a 10 µm wide region, and the broad area laser array has 10 elements (N=10), each 100 µm (M=10) wide. Then the overall probability of failure is 100 P.

For a segmented laser array with the same number N=10 of laser elements, each segmented into M=10 segments, each 10 µm wide, the probability of failure of the entire laser array is the probability of a two segment loss in any one of the laser elements, i.e. N×C($^M_2$)×P$^2$×(1−P)$^{M-2}$, where C($^M_2$) is the number of combinations of two out of M segments and where (1−P)$^{M-2}$≈1 for p<<1. For the particular example given here (M=10; N=10), the probability works out to about 450 P$^2$. The reduction in probability of laser array failure by segmenting is 100 P÷450 P$^2$=0.22/P. For a probability P of failure of one 10 µm local region of a device in 10,000 hours of 0.1%, the reduction in failure probability is 220-fold or more than two orders of magnitude. This is a probability of failure for the broad area laser of about 10%, but only 0.045% for the segmented laser.

Accordingly, a method of making a diode laser source in accord with the present invention with a particular optical power, brightness and reliability begins by first specifying the optical power and brightness for a laser beam to be produced by the diode laser source. These specifications will depend upon the exact application for which the source is to be used, and can be determined in advance by the applications designer and communicated to the laser diode's manufacturer. From these specifications, the overall aperture size, $a_0$, for the diode laser source s determined according to the known properties of the laser diode, including power output and divergence characteristics of similar broad aperture laser diodes. The acceptable failure rate, $R_0$, for the diode laser source over a fixed number of operating hours is also specified. Again this may-depend on the particular application for which the source is to be used and may be communicated by the applications designer to the laser diode manufacturer.

Next, a monolithic laser diode with a plurality of commonly addressed light emitting segments is formed, where the combined optical power from all of the segments equals the specified optical power for the diode laser source as a whole and where the combined aperture size of all of the segments equals the previously determined overall aperture size, $a_0$. In order to meet the reliability requirement specified by the acceptable failure rate, $R_0$, each segment in the laser diode has an individual segment aperture size, $S_0$, and spacing from adjacent segments selected such that the segment attains a segment lifetime determined according to the relationship: segment lifetime=$\alpha/S_0$. Here, $\alpha$ is a process-related proportionality constant, generally increasing with segment spacing, that depends on the particular process techniques used to make the laser diode, and can be determined in advance through experimentation by the laser diode manufacturer. The segment lifetime attained by the selection of the segment aperture size, $S_0$, provides a probability of failure of the overall diode laser source, determined as in the example given above, in a fixed number of operating hours which is less than or equal to the specified acceptable failure rate, $R_0$, in that number of operating hours.

Once the laser diode has been formed, focusing optics are disposed in front of the laser diode to condense the light output from the plurality of segments to a spot. This may include beam filling optics, such as a lens array, with each lenslet of the array disposed in front of one of the segments, as in FIGS. 1–3.

The method may be easily extended to multi-element laser arrays, where each element is made up of a plurality of light emitting segments, as in FIG. 4.

What is claimed is:

1. A multibeam optical unit comprising;
   a plurality of laser elements formed in a monolithic laser diode array, each laser element comprising a plurality of laser emitters addressable as an emitter group providing an output of plural light beams;
   means for electrically addressing said laser elements independently of one another;
   beam optics disposed in front of each of said laser elements, said beam optics including a lens system disposed in front of and aligned with a corresponding one of said laser emitter groups to converge the light beams emitted from the plural emitters of an emitter group into a single overlapping spot for that group to preserve their overall brightness;
   said emitter groups forming with said beam optics a plurality of high intensity, single overlapped light spots, each of which comprises light beams from all of the emitters of an emitter group so that, at a focal plane of said beam optics, a plurality of spatially aligned high intensity overlap spots is formed substantially aligned in a plane of said laser elements, failure of any one or emitters in any particular emitter group will cause only a slight decrease in optical power and brightness with substantially no size change in its single overlapped light spot.

2. The multibeam optical unit of claim 1 wherein said beam optics permits divergence of light from said laser emitters to said beam optics.

3. The multibeam optical unit of claim 1 wherein the number of laser emitters in each laser element is in a range from about 5 to about 20.

4. The multibeam optical unit of claim 1 wherein a width of each laser emitter is less than 20 μm.

5. The multibeam optical unit of claim 1 wherein a center-to-center spacing of the laser emitters forming each laser element is in a range from 20 μm to 50 μm.

6. The multibeam optical unit of claim 1 wherein the number of individually addressable laser elements is in a range from about 10 to about 20.

7. The multibeam optical unit of claim 1 wherein said lens system comprises a single monolithic lens arrays structure.

8. The multibeam optical unit of claim 1 wherein said lens system comprises a single monolithic binary diffractive optics lens array structure.

9. The multibeam optical unit of claim 1 wherein said unit is used in a laser printing system.

10. The multibeam optical unit of claim 9 wherein said laser printing system includes a light sensitive medium.

11. A multibeam optical unit comprising:

a laser diode array comprising a plurality of laser diode emitters each emitting a separate diverging light beam from its respective emitter, said emitters being sufficiently separated from one another to permit separate operation among the emitters;

said laser diode array divided into a plurality of subarrays of diode lasers, said diode laser emitters of each subarray being driven as a group from a single current source so that said subarrays in said laser diode array are independently addressable;

optical means in alignment to receive the light beams from said array for reducing their divergence in at least one orthogonal direction; and a plurality of lenslet arrays, one of said lenslet arrays for each of said subarrays and comprising a plurality of separate lenslets, one for each of the light beams of the subarray, for focusing each of the light beams in orthogonal beam directions in overlapped relation to form a single light spot for delivery to a beam application.

12. The multibeam optical unit of claim 1 wherein said optical means is a cylinder lens.

13. The multibeam optical unit of claim 1 wherein said beam application is a laser printing system.

14. The multibeam optical unit of claim 13 wherein said laser printing system includes a light sensitive medium.

15. The multibeam optical unit of claim 11 wherein said optical means for each of said subarrays produces a plurality of aligned light spots of overlapped light beams from respective subarrays at the focal plane.

16. The multibeam optical unit of claim 11 wherein said lenslet comprises an input lens surface for collimating the light beam and an output lens surface for focusing the light beam to a light spot at said focal plane.

17. The multibeam optical unit of claim 16 wherein output lens surface focuses the light beam to said single light spot at said focal plane.

18. The multibeam optical unit of claim 16 wherein output lens surface lenslets is a separate lens unit positioned in optical alignment between said lenslet array and said focal plane.

19. The multibeam optical unit of claim 16 wherein at least one of said lenslet lens surfaces is a binary optics lens.

20. The multibeam optical unit of claim 16 wherein at least one of said lenslet lens surfaces is a refractive lens.

21. The multibeam optical unit of claim 16 wherein said input lens surface is a plurality of small lenslets.

22. The multibeam optical unit of claim 11 wherein said lenslet array is positioned from said subarray to permit each of the individual light beams of said subarray to optically fill a respective lenslet.

23. The multibeam optical unit of claim 11 wherein the number of subarrays in said array are in the range from about 5 to about 20.

24. The multibeam optical unit of claim 11 wherein said individually addressable subarrays are independently modulated.

25. A multibeam optical unit comprising:

a laser source comprising a plurality of subarrays with each subarray having a plurality of emitters spaced a predetermined distance from one another;

means for independently electrically addressing the emitters of each of said laser subarrays as a single group;

an optical lens unit for each of said laser subarrays comprising a first lens unit having a plurality of lenslets, one for each emitter of said laser subarrays to provide beam filling of said light beams within each of the respective lenslets so that the spacing between adjacent emitters at the source of each of said laser subarrays is reduced or substantially eliminated at said first lens unit.

26. The multibeam optical unit of claim 25 wherein said optical lens unit for each of said laser subarrays further comprises a second lens unit positioned between said laser subarray and said first lens unit for reducing beam divergence in at least one orthogonal direction.

27. The multibeam optical unit of claim 25 wherein said optical lens unit further focusing the respective light beams of said laser subarray in overlapped relation to form a single light spot for delivery to a beam application.

28. The multibeam optical unit of claim 27 further comprising adjacently aligned laser subarrays comprising said laser source producing a plurality of spatially aligned light spots each comprising overlapped light beams from a respective laser subarray for de to said beam application.

29. The multibeam optical unit of claim 25 wherein the number of subarrays in said laser source is in the range from about 5 to about 20.

30. The multibeam optical unit of claim 25 wherein said subarrays are independently modulated.

31. The multibeam optical unit of claim 25 wherein said optical lens unit includes a cylinder lens.

32. The multibeam optical unit of claim 25 wherein said optical lens unit includes a refractive lenslet or binary diffractive lenslet array.

33. The multibeam optical unit of claim 25 wherein said optical lens unit further includes a lens for delivery of said light spot to said beam application.

34. In a laser printing system, a multibeam optical unit comprising:

a laser source comprising a plurality of subarrays with each subarray having a plurality of emitters spaced a predetermined distance from one another and producing diverging light beams with intervening dead spacing;

means for independently electrically addressing the emitters of each of said laser subarrays as a single group;

an optical lens unit for each of said laser subarrays comprising a first lens unit having a plurality of lenslets, one for each emitter of said lager subarrays to provide beam filling of said light beams within each of the respective lenslets so that the intervening dead spacing between adjacent light beams at the source of each of said laser subarrays is reduced or substantially eliminated;

said optical lens unit further focusing the respective light beams of each said laser subarrays in overlapped relation to form a plurality of spatially separate light spots for delivery to the laser printing system.

35. In the laser printing system of claim 34, wherein said laser printing system includes a light sensitive medium.

* * * * *